United States Patent
Wang

(10) Patent No.: US 6,798,134 B2
(45) Date of Patent: Sep. 28, 2004

(54) ORGANIC ELECTROLUMINESCENT DEVICE WITH IMPROVED LIFETIME

(75) Inventor: Wen-Chun Wang, Taichung (TW)

(73) Assignee: Windell Corporation, Taichung (TW)

( * ) Notice: Subject to any disclaimer, the term of this patent is extended or adjusted under 35 U.S.C. 154(b) by 16 days.

(21) Appl. No.: 10/300,126

(22) Filed: Nov. 19, 2002

(65) Prior Publication Data

US 2004/0095065 A1 May 20, 2004

(51) Int. Cl.$^7$ .................. H05B 33/00; H05B 33/14; H05B 33/18
(52) U.S. Cl. .................. 313/504; 313/506; 428/690; 428/917
(58) Field of Search ................. 313/504, 506, 313/509; 428/690

(56) References Cited

U.S. PATENT DOCUMENTS

| | | | | |
|---|---|---|---|---|
| 5,281,489 A | * | 1/1994 | Mori et al. | 428/690 |
| 5,674,597 A | * | 10/1997 | Fujii et al. | 313/504 |
| 5,804,322 A | * | 9/1998 | Shi et al. | 428/690 |
| 5,925,980 A | * | 7/1999 | So et al. | 313/504 |
| 6,064,151 A | * | 5/2000 | Choong et al. | 313/504 |
| 6,114,055 A | * | 9/2000 | Choong et al. | 428/690 |
| 6,130,001 A | * | 10/2000 | Shi et al. | 428/690 |
| 6,194,089 B1 | * | 2/2001 | Choong et al. | 428/690 |
| 2003/0134146 A1 | * | 7/2003 | Aziz et al. | 428/690 |

* cited by examiner

*Primary Examiner*—Ashok Patel
*Assistant Examiner*—Mariceli Santiago
(74) *Attorney, Agent, or Firm*—Birch, Stewart, Kolasch & Birch, LLP

(57) ABSTRACT

The present invention relates to an organic electroluminescent device comprising a gradual organic electroluminescent layer $A_xB_yC_z$ inserted between an anode electrode (may include a hole injection layer) and a cathode electrode, wherein A, B, and C are mediums capable of transporting holes, transporting electrons and injecting electrons respectively, and x, y, and z denote the content of medium A, B, and C respectively. The gradual layer with different materials combined is a mixed continuous organic medium without heterojunctions, wherein the sum of x, y, and z is 100%. Moreover, x has a maximum, value adjacent to the anode electrode, and the sum of y and z has a maximum value adjacent to the cathode electrode, while the medium C is an electron injection component comprising either a low work function metal, metal compound, metal alloy, or an organic material with high electron affinity.

13 Claims, 1 Drawing Sheet

ORGANIC ELECTROLUMINESCENT DEVICE WITH IMPROVED LIFETIME

FIELD OF THE INVENTION

The present invention pertains to an organic electroluminescent device, and more specifically to a structure for improving the efficiency and lifetime of an organic electroluminescent device.

BACKGROUND OF THE INVENTION

In recent progress of organic electroluminescent device, the organic EL devices are attractive owing to the merits of high brightness, wide viewing angle, low driving voltage and capability for full color flat portable emissive displays. The normal organic electroluminescent device composes multi-layers of thin film sandwitched between two electrodes. The organic layer composes bole transporting layer, light emission layer and electron transporting layer. Either the electron transporting layer or the hole transporting layer can be designed as the emission layer and the light can be transmitted either way but generally exits through one of the conductive layers. There are many methods to modify one of the conductive layers for the emission of light there through but it has been observed that the most efficient organic electroluminescent device includes one conductive layer, which is transparent to the light being emitted. The widely used material for this conductive and transparent layer is indium-tin-oxide (ITO), which is usually deposited on a transparent substrate, for example, the glass plate.

Although the multi-layer structure is normally used in constructing the organic electroluminescent devices, the interface between the electron transporting layer and hole transporting layer is not compatible and results in a bad junction in the interface of the different layers and eventually causes the stripped off phenomenon in the device under high temperature condition. Also the lifetime of multi-layered organic electroluminescent devices is influenced by the abrupt change of interface interface between the hole and electron transporting layers when the organic EL device is under voltage bias.

Significant improvement of electroluminescent device has been achieved in the prior art (See U.S. Pat. No. 5,925,980). In the patent, a structure of electroluminescent device which comprises a hole transporting region, an electron transporting region and a graduated region disseminated between the hole transporting region and the electron transporting region is provided. The graduated region changes, either in steps or continuously, from the hole transporting organic material adjacent to the hole transporting region to the electron transporting organic material adjacent to the electron transporting region. Further improvement is still needed for applications where lifetime is a primary concern. The lifetime of an organic electroluminescent device is affected by the stability of both the bulk morphology of the hole transporting materials and the interface between the hole and electron transporting layers when the organic electroluminescent device is under bias.

Several schemes have also been proposed to address the problem of bulk morphology stability of the hole transporting material in an organic electroluminescent device. Among other things, the lifetime of the electroluminescent device is improved by the elimination of heterojunction in a continuous organic medium (See U.S. Pat. No. 6,130,001). In the patent, it provides an organic electroluminescent layer which comprises a continuous organic medium $A_xB_y$ where A and B are components capable of transporting electrons and holes, respectively, where x represents the content of A component with a value ranging from 0 adjacent to the anode to 100% adjacent to the cathode, and y represents the content of B component with a value ranging from 0 adjacent to the cathode to 100% adjacent to the anode. The lifetime of the device is hence improved by the elimination of heterojunctions in the continuous organic medium.

Generally, there is always a need to provide a smooth reliable region so that the interface effect can be reduced to a minimum. However, the smooth reliable region should not come at the expense of the efficiency of the organic electroluminescent device. Also, the elimination of the difference in the interface between different layers will give the electroluminescent device with greatly improved reliability and lifetime.

It is a purpose of the present invention to provide a new and simplified organic electroluminescent device with an improved lifetime.

It is another purpose of the present invention to provide a new and simplified organic electroluminescent device to enhance electron injection capability and to achieve emitting high efficiency.

It is still another purpose of the present invention to provide a new and simplified organic electroluminescent device with improved stability.

SUMMARY OF THE INVENTION

The above problems and others are at least partially solved and the above purposes and others are realized in an organic electroluminescent device including a single organic coating layer with a continuous medium inserted between the anode electrode and the cathode electrode.

The single organic layer in this invention comprises three components, which include hole transporting material, electron transporting material, and electron injecting material. The composition medium for forming the single organic layer is $A_xB_yC_z$, wherein A is the component capable of injecting and transporting holes, B is the component capable of transporting electrons, C is the component capable of injecting electrons and x, y, and z denote the content of component A, B, and C respectively. The single organic layer with different materials is a mixed and continuous organic medium without heterojunctions.

Furthermore, the content x, y, and z in component A, B, and C have the characteristics that the sum of x, y, and z is 100%. Moreover, x has a maximum value adjacent to the anode (may include a hole injection layer), and the sum of y and z has a maximum value adjacent to the cathode. It should be pointed out that the organic medium for use further comprises at least one fluorescent, phosphorescent dye or pigment in the single organic electroluminescent layer of the formula $A_xB_yC_z$.

The component C is an electron injection component including an organic medium with high electron affinity. On the other hand, the component C may also comprise inorganic material such as a low work function metal, metal alloy, or metal compound.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE INVENTION

Figure 1:
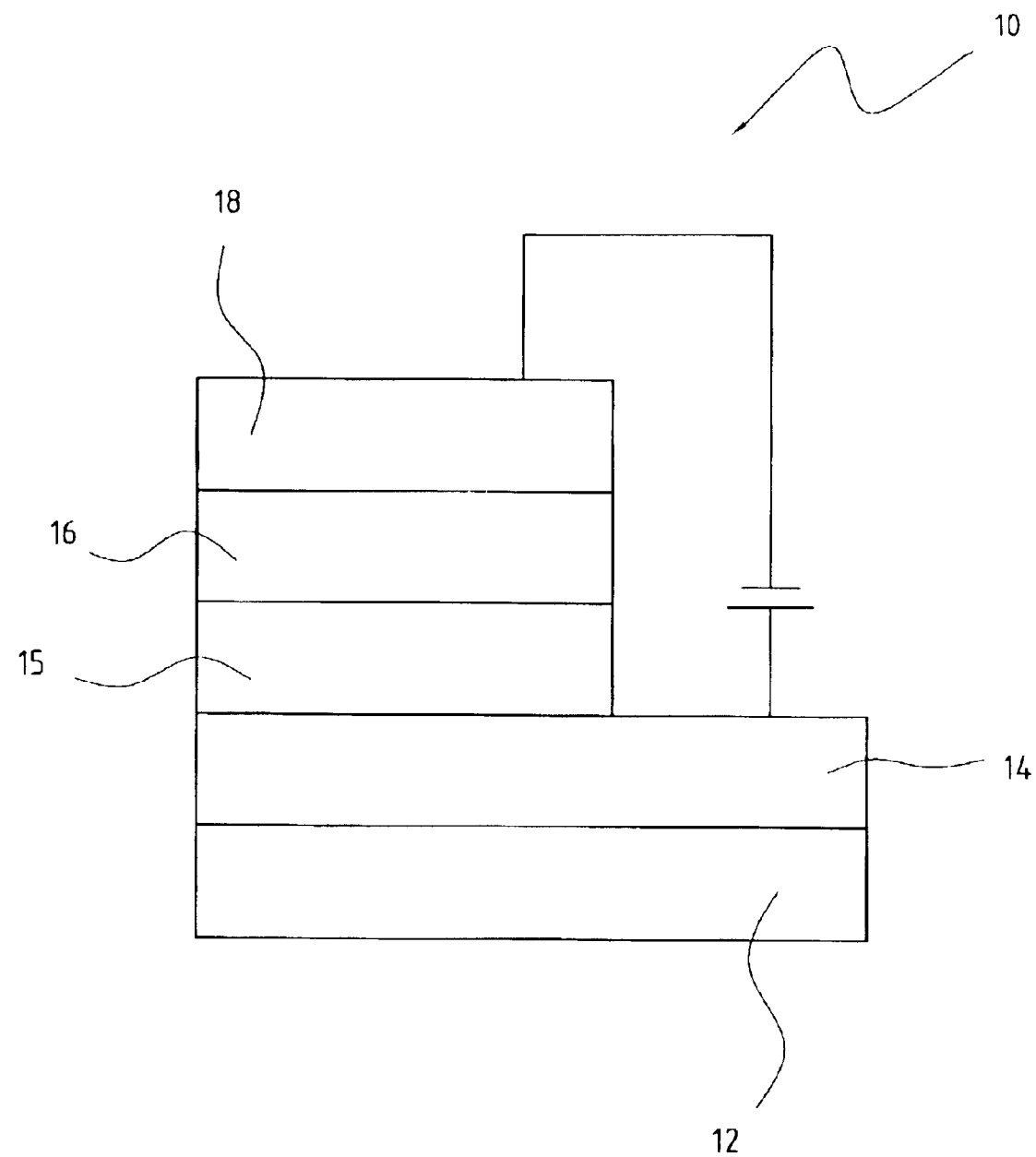
FIG. 1 depicts a simplified sectional view of an organic electroluminescent (EL) device in this invention.

Referring now to FIG. 1, a simplified sectional view of an organic electroluminescent (EL) device 10 in accordance with the present invention is illustrated. The organic electroluminescent (EL) Device 10 is fabricated upon a substrate 12 which is transparent in this preferred embodiment, and may be fabricated of any of a number of known materials employed in the art. For example, substrate 12 may be fabricated of a glass, such as Corning 7059 glass, transparent plastic substrate made of polyolefins, polyethersulfones, polyarylates, etc.

Deposited atop substrate 12 is an anode 14, which is conductive and optically transparent or semi-transparent. The material used for the anode 14 includes conductive metal oxides such as indium oxide, indium-tin oxide (ITO), zinc oxide, zinc-tin oxide, conductive transparent polymers such as polyaniline. The anode 14 can also be made of a semi-transparent metal, which includes a thin layer (<500 angstroms) of gold, copper, silver, and combinations thereof.

Thereafter, atop the anode 14 is a hole injection layer 15 that also acts as a buffer layer to match the thermal and mechanical properties between the anode electrode mid the subsequent layers of organic materials. Hole injection layer 15 for use in this invention is also capable of transporting holes. It is to be understood that the hole injection layer 15 is an optional layer, which implies that it may not be necessary in the device.

Deposited atop the hole injection layer 15 (if present) is an organic gradual layer 16 inserted between the anode 14 and the cathode 18. In this embodiment, the gradual layer is composed of a mixed continuous organic medium without heterojunctions. The continuous organic medium has a general formula of $A_xB_yC_z$ wherein A component comprises the hole transporting material, B component comprises electron transporting material, C component comprises electron injecting material and x, y, and z denote the content of the components A, B, and C respectively. Furthermore, the content x, y, and z in A, B, and C have the characteristics described in the following paragraph.

The sum of x, y, and z is 100% and, moreover, x has a maximum value adjacent to the anode side (may include a hole injection). The content of x decreases toward the cathode side, and thus the content x has a minimum value adjacent to the cathode side. In this way, when the content of x is minimum, the summary content of y and z should appear as a maximum value adjacent to the cathode. The component C is an electron injection component including an organic medium with high electron affinity. On the other hand, the component C may also comprise inorganic material such as a low work function metal, metal alloy, or metal compound. The component C facilitates the functions of injecting electrons and charge transportation in this layer, which also makes the electron drive easily from the cathode and across this layer, thus improving the emission power efficiency of the organic EL device. It should be pointed out that the organic medium for use further comprises at least one fluorescent, phosphorescent dye or pigment in the single organic layer of the present invention of formula $A_xB_yC_z$.

In the extreme cases, the content x of component A is gradually reduced from 100% adjacent to the anode 14 side to 0% adjacent to the cathode 18 side, and hence the value of the sum of y and z is gradually decreased from 100% adjacent to the cathode 18 side to 0% adjacent to the anode 14 side. In another preferred embodiment, z could be a function of y plus z, wherein the content of z in this case may lie within the range of 0 to 100%. The variations of x, y and z content are distributed stepwise in the organic structure. Although there is an abrupt change in the content, the content is still deposited in a continuous way and the transition region also appears as a continuous smooth transition due to interdiffusion effect during the deposition process. The variations of x, y and z may also be substantially linear. It should be understood by those skilled in the art that variations other than step or linear may also be incorporated. The deposition rate of component A, B, and C can be controlled easily by the valve release of the evaporation process.

The materials for the structure are conducted by mixed evaporation technique through the valve release of the different gases. The components A, B, or C in the $A_xB_yC_z$ medium can be any one of the hole transporting, electron transporting and electron injection materials, respectively. The hole transporting material is preferably comprised of porphyrinic compound or organic tertiary aromatic amines. The electron transporting material is preferably selected from the group of organometallic complexes.

For the organic electron injection material, it is preferably selected from an organic medium with high electron affinity (Ea). In general, there's a well-established method to achieve high electron affinity by the attachment of groups in organic material such as nitro, carbonyl, cyano, metal complex of quinoline, oxadiazole, quinoxanline, and silole derivatives.

On the other hand, for inorganic material tie the electron injection material, it may preferably include the low work function metals such as alkaline metal, metal alloy such as Li—Al, Sr—Al, or Cs—Al, and metal compound such as LiF, LiCl, and $LiO_2$.

The material used for fabrication of the cathode 18 is typically formed of a metal with a work function of less than 4 eV. The material for the low work function is selected from a group of lithium magnesium, calcium, or strontium while the preferred high work function metal is selected from a group of aluminum, indium, copper, gold, or silver. Alternatively, the cathode can be made of an alloy of a lower work function metal and a higher work function metal by coevaporation technique.

While the preferred embodiment includes a transparent substrate and anode, it will be understood by those skilled in the art that the entire structure could be reversed so that the light is emitted upwardly in FIG. 1 and the substrate could then be opaque material.

In this embodiment, generally, the hole transporting, electron transporting, electron injecting materials are deposited on a surface by any of the well known evaporation or sputtering techniques. In a typical example, the substrate 12 is positioned in an evaporation chamber (not shown). A source of electron transporting organic material, a source of electron injecting material, and a source of hole transporting organic material are positioned sequentially in the evaporation chamber. In this preferred embodiment the three sources are put in separate containers, which can be gradually and continuously opened or closed.

Because of the gradual content change of each component from the cathode side to the anode side, the gradual organic layer that combines at least three materials intermixed and disseminated between the anode and the cathode. The layer with these components appears as a single layer with mixed quality together. This gradual layer appears as a single layer and cannot be easily separated and generally allows a smooth movement of carriers (both electron and hole) there across.

In this embodiment, the gradual region 16 is formed by carefully controlling the content of the components in the release of the valves on each source of the injecting device so that the hole transporting material A is reduced as the electron transporting material B and the electron injection material C are increasing, in the direction of the anode side to the cathode side.

Accordingly, a new and improved method has been disclosed for fabricating a new organic semiconductor layer. While evaporation coating is presently the primary method for depositing these materials, it will be understood by those skilled in the art that the present method applies to any other techniques (e.g. sputtering) which might be utilized or devised.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An organic electroluminescent device comprising:
   an anode electrode and a cathode electrode;
   a hole injection layer inserted between said anode electrode and said cathode electrode; and
   a gradual layer inserted between said cathode electrode and said hole injection layer, said gradual layer defining an electroluminescent region and comprising a mixed continuous medium having medium A, medium B and medium C with a formula of AxByCz in which x, y, z denote the content of mediums A, B and C respectively;
   wherein said medium A comprises a hole transporting material, said medium B comprises an electron transporting material, and said medium C comprises an electron injecting material.

2. The organic electroluminescent device as claimed in claim 1, wherein the sum of said x, y and z is 100%.

3. The organic electroluminescent device as claimed in claim 1, wherein said x has a maximum value adjacent to said anode electrode.

4. The organic electroluminescent device as claimed in claim 1, wherein the sum of said y and said z in said formula has a maximum value adjacent to said cathode electrode.

5. The organic electroluminescent device as claimed in claim 1, wherein said gradual layer with the formula of AxByCz further comprises at least one fluorescent, phosphorescent dye or pigment.

6. The organic electroluminescent device as claimed in claim 1, wherein said hole transporting material comprises a porphyrinic compound or organic tertiary aromatic amines.

7. The organic electroluminescent device as claimed in claim 1, wherein said electron transporting material is selected from the group of organometallic complexes.

8. The organic electroluminescent device as claimed in claim 1, wherein said electron injecting material is an organic medium with high electron affinity.

9. The organic electroluminescent device as claimed in claim 8, wherein the electron injecting material comprises at least one of nitro, carbonyl, cyano, or metal complex of quinoline, oxadiazole, quinoxanline, and silole derivatives.

10. The organic electroluminescent device as claimed in claim 1, wherein said electron injecting material comprises an inorganic medium with low work function.

11. The organic electroluminescent device as claimed in claim 10, wherein said inorganic medium with low work function comprises a low work function metal material selected from the group consisting of metal, metal alloy and metal compound, said metal including at least alkaline, said metal alloy including at least one of Li—Al, Sr—Al and Cs—Al, and said metal compound including at least one of LiF, LiCl and LiO$_2$.

12. The organic electroluminescent device as claimed in claim 1, wherein said cathode electrode comprises a material selected from a group consisting of lithium, magnesium, calcium, and strontium.

13. The organic electroluminescent device as claimed in claim 1, wherein said cathode electrode comprises a material selected from a group consisting of aluminum, indium, copper, gold and silver.

* * * * *